United States Patent
Weng et al.

(10) Patent No.: US 6,483,338 B2
(45) Date of Patent: Nov. 19, 2002

(54) METHOD AND SYSTEM OF TESTING A CHIP

(75) Inventors: Chih-Hsien Weng, Miaoli (TW); Jan-Shian Shiao, Changhua (TW); Wen-Hsu Huang, Changhua (TW)

(73) Assignee: VIA Technologies, Inc., Taipei (TW)

( * ) Notice: Subject to any disclaimer, the term of this patent is extended or adjusted under 35 U.S.C. 154(b) by 51 days.

(21) Appl. No.: 09/734,559

(22) Filed: Dec. 13, 2000

(65) Prior Publication Data

US 2001/0050575 A1 Dec. 13, 2001

(30) Foreign Application Priority Data

Mar. 8, 2000 (TW) .......................................... 89104206

(51) Int. Cl.[7] ........................ G01R 31/26; G01R 31/02; H01H 31/02
(52) U.S. Cl. ........................ 324/765; 324/763; 324/537
(58) Field of Search ................. 324/765, 763, 324/537, 158.1, 73.7

(56) References Cited

U.S. PATENT DOCUMENTS

| | | | | | |
|---|---|---|---|---|---|
| 4,860,287 | A | * | 8/1989 | Kelly | 370/517 |
| 5,032,783 | A | * | 7/1991 | Hwang et al. | 324/537 |
| 5,107,208 | A | * | 4/1992 | Lee | 324/73.1 |
| 5,430,859 | A | * | 7/1995 | Norman et al. | 703/23 |
| 5,600,247 | A | * | 2/1997 | Matthews | 324/426 |
| 5,604,432 | A | * | 2/1997 | Moore et al. | 324/73.1 |
| 6,038,226 | A | * | 3/2000 | Ellersick et al. | 370/352 |
| 6,166,990 | A | * | 12/2000 | Ooishi et al. | 365/233 |
| 6,191,603 | B1 | * | 2/2001 | Muradali et al. | 324/765 |

* cited by examiner

Primary Examiner—Michael Sherry
Assistant Examiner—Jermele Hollington
(74) Attorney, Agent, or Firm—Rabin & Berdo, P.C.

(57) ABSTRACT

A method and system of testing a chip for testing a circuit module in the chip. The system is integrated into the chip. The reference clock and the test command are sent to the testing system serially. The testing system, in response to the test command, performs test actions on the circuit module, producing a test result. The test result is serially sent to the test machine.

16 Claims, 7 Drawing Sheets

METHOD AND SYSTEM OF TESTING A CHIP

BACKGROUND OF THE INVENTION

This application incorporates by reference Taiwanese application serial No. 89104206, filed on Mar. 8, 2000.

1. Field of the Invention

The invention relates in general to a method and system for testing integrated circuits (IC) and more particularly to a method and system for testing IC with test commands being received and outputted serially.

2. Description of the Related Art

The functionality of IC chips needs to be confirmed before the completion of its manufacturing. As such, the cost of testing an IC chip is regarded as an integral and major contributor to the overall cost of the chip and so, the less time it takes to complete the test, the less it will cost, and thus improve the competitiveness of the chip in the market. The testing of the IC chip is performed by a test machine which generates predefined test commands for the chip. The commands may either target specific functions in a collection of chips or a variety of functions in a specific chip. A test machine is regarded as an efficient one, thereby reducing the cost of the chip, if it detects several defective chips within a short period of time. The test commands and the following test results are conventionally transferred between the test machine and the chips in parallel input/output (PIO) manner. Thus, a number of pins on a chip are utilized to transfer the test commands and the test results. For instance, when 8-bit test commands are used in the testing of specific chips, eight pins on the chips will be used for transferring the test commands and the test results between the test machine and the chips.

The current trend in chip design is towards the integration of multiple functions into a single chip. However, the number of functions a single chip can handle is directly related to the number of functional pins on the chip. As mentioned before, the PIO method of testing IC chips requires the use of some pins of the chip. Before the advent of integrating several chips onto one, the number of pins of available for transferring commands and results in PIO manner were more than enough. Thus, the PIO method of testing is suitable for the individual chip. When individual chips are integrated into a single chip however, the number of available pins is decreased. If the number of pins that are available for testing purpose is smaller than the number of pins that are required to implement PIO, PIO method is not suitable for the integrated chip.

When the PIO test method is not applicable due to the lack of available pins, one solution is to apply pin-sharing to the chip design. When pin-sharing is applied to chip design, the pins of a chip become multifunctional (i.e. when operating in some situation, specific pins are used by a specific functional block. And in another situation, these pins are used by another functional block.) The major drawback of pin-sharing is that the design becomes complicated as the number of sharing pins is increased.

Since the number of pins on an IC chip is directly proportional to its size, a general trend nowadays is towards the minimization of the number of pins on a chip. This trend will obviously compound the issue of lack of pins and thus pin-sharing will become a serious problem.

SUMMARY OF THE INVENTION

It is therefore an object of the invention to provide a method and system for testing a chip with test commands transferred serially. According to the object of the invention, the testing system utilizes less number of pins for transferring test commands which will lessen the problem of complicated circuit design arising due to the use of the pin-sharing method.

According to the object of the invention, it provides a testing system in a chip, which is used for testing a circuit module of the chip. The testing system receives a reference clock and a test input signal outputted serially from a test machine. The testing system includes a serial/parallel converting circuit, a command port, a selector, a test data decoder, and a controlling circuit. The serial/parallel converting circuit is used for receiving the reference clock and the test input signal serially, producing a test command signal in parallel, and sending a test output signal to the test machine. The command port is used for receiving and storing the test command signal, and for outputting a first test signal and a second test signal. The selector is used for receiving the second test signal and producing a selection signal for selecting the circuit module of the chip. The test data decoder is used for receiving the first test signal, producing a test data signal as an input to the circuit module selected. The controlling circuit is used for outputting a controlling signal into the circuit module selected, wherein the circuit module produces the test output signal.

According to the object of the invention, it provides a testing system in a chip, which is used for testing a circuit module of the chip. The testing system receives a reference clock and a test input signal outputted from a test machine serially. The testing system includes a serial/parallel converting circuit, a command port, and a decoding/controlling circuit. The serial/parallel converting circuit is used for serially receiving the reference clock and the test input signal, producing a test command signal in parallel, and sending a test output signal to the test machine. The command port is used for storing and outputting the test command signal. The decoding/controlling circuit is used for receiving the test command signal, and producing a controlling signal and a test data signal, wherein the circuit module of the chip, in response to the controlling signal and the test data signal, produces the test output signal.

According to the object of the invention, it also provides a method of testing a chip, for testing at least one circuit module of the chip. The method includes the steps as follows. First, a test command is inputted serially. The test command is then decoded as a test data signal. Next, a test output signal is obtained after the circuit module to be tested receives the test data signal. Finally, the test output signal is outputted serially.

According to the object of the invention, it also provides a system of testing a chip, for testing a circuit module of the chip. The system is integrated into the chip and receives a reference clock and a test input signal from a test machine serially. The system includes a serial/parallel converting circuit, a command port, a decoder, and a state machine. The serial/parallel converting circuit is used for receiving the reference clock and the test input signal serially, producing a test command signal in parallel, and sending a test output signal to the test machine. The command port is used for receiving and storing the test command signal. The decoder is used for decoding the test command signal as a first decoded signal and a second decoded signal, wherein, in response to the first decoded signal, the circuit module produces an output signal. The state machine, in response to the second decoded signal and the output signal, produces the test output signal, which is sent to the test machine.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

The testing system according to the preferred embodiment of the invention disclosed in the following description is integrated into a chip. This integrated testing system cooperates with the test machine for the testing of the chip. The chip includes at least one embedded SRAM. It is certain that, through appropriate modification, the invention is applicable to the testing of chips other than embedded SRAM.

Figure 1:
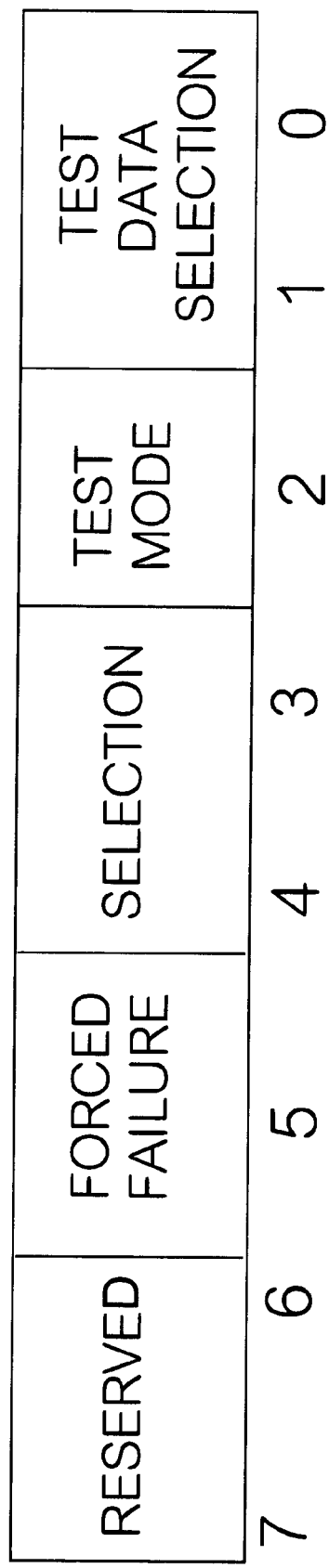
FIG. 1 shows the data structure of the test command according to a preferred embodiment of the invention.

For the sake of clarification, the data structure of the test command is described first. Referring now to FIG. 1, a test command format of 8 bits is illustrated and is divided into 5 fields. It should be noted that the bit length, field numbers, and contents of the field are adjustable to meet the needs of implementation.

FIG. 1 shows the 5 fields according to the bit number from 0 to 7 of the 8-bit command. The first field, called the test data selection field, is defined as bits 0 and 1 of the test command. During the test, the test data selection field indicates the data pattern that is written into the memory being tested. Since the test data selection field contains two bits, there are four combinations (00, 01, 10, and 11) yielding four different data pattern definitions after appropriate decoding.

The second field, called the test mode field, is defined as bit 2 of the test command. In this embodiment, there are two test modes, namely, a scan mode and a read-after-write mode. When bit 2 is set to 0, it indicates the scan mode and when bit 2 is set to 1, it indicates the read-after-write mode. In the scan mode, the test data is first written into the memory being tested until all of the memory space is full. Next, all of the data stored in the memory are read. Finally, comparison of the read data with the original data is performed. In the read-after-write mode, the test data is first written into the memory corresponding to a certain address. After that, the data corresponding to the address is immediately read out and is compared with the original data.

The third field, called the selection field, is defined as bits 3 and 4. When a number of memory devices are to be tested in the chip, the selection field indicates which memory device is to be tested during the test.

The fourth field, called the forced failure field, is defined as bit 5. When the forced failure field is set to 1, it indicates the testing system has detected a failure of the memory being tested and the testing system terminates the test immediately. The forced failure field provides the testing system with an ability to terminate the test when a failure of the memory is detected. By the application of this field, the scenario of the test continuing past a detected error will be avoided.

The fifth field, called the reserved field, is defined as bits 6 and 7. This field is not defined here and reserved for future use.

Figure 2:
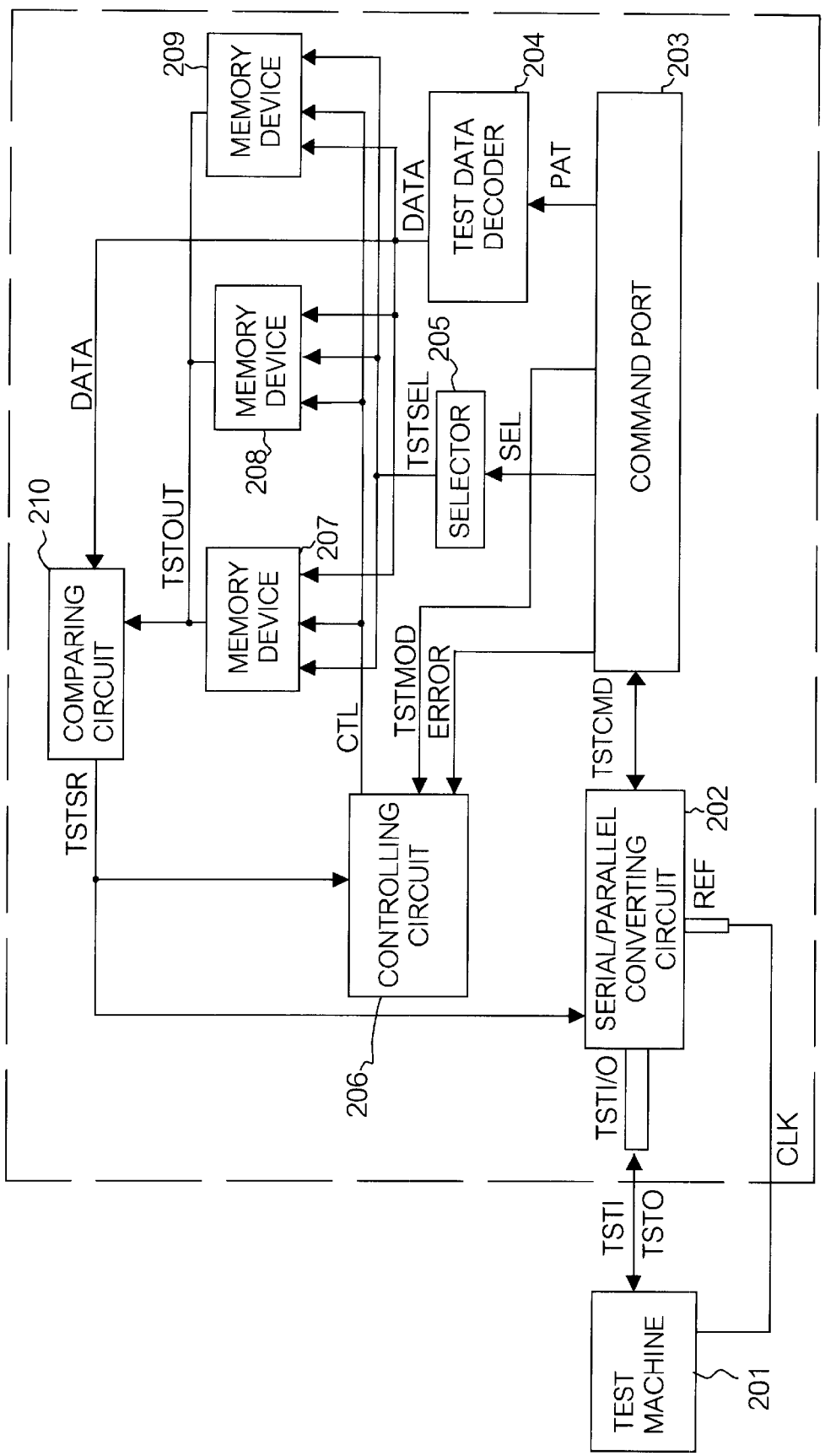
FIG. 2 shows the block diagram of the testing system according to the preferred embodiment of the invention.

Referring now to FIG. 2, it shows the testing system in block diagram form. All of the elements of FIG. 2 are integrated into a chip 200 except for the test machine 201. In this embodiment, it shows the testing system cooperating with the test machine to test the memory devices and test commands are serially used in the communication of the testing system and the test machine. The test commands are converted into the test actions which are processed by the internal circuitry of the chip 200, for obtaining test results that are outputted serially. In this embodiment, the memory devices being tested are embedded SRAMs.

First, the test machine 201 serially outputs a test input instruction signal (TSTI) and a reference clock signal (CLK) into a serial/parallel converting circuit 202. The CLK is the internal clock suitable for the test machine, such as the peripheral component interconnect (PCI) clock. In the following, the way that TSTI is outputted by the test machine and transferred to the serial/parallel converting circuit 202 is described.

The test machine sends an input starting signal to the serial/parallel converting circuit 202 to inform the serial/parallel converting circuit 202 that preparation should be taken for receiving the test command (TSTCMD). The data structure of TSTCMD is described as in FIG. 1. The test machine 201 then transmits the bits of the TSTCMD to the serial/parallel converting circuit 202 in a bit-by-bit manner. This data-transmission manner is called serial transmission. Finally, the test machine sends an input ending signal to the serial/parallel converting circuit 202 to inform the serial/parallel converting circuit 202 that the transmission of TSTCMD ends.

When the bits of the test command TSTCMD have been transmitted completely, the serial/parallel converting circuit 202 combines the bits for forming the complete TSTCMD. After that, the serial/parallel converting circuit 202 outputs the test command TSTCMD to the command port 203 in parallel.

Parallel transmission is the opposite of serial transmission. In parallel transmission, the TSTCMD is sent all at once whereas, in serial transmission, the bits of the test command TSTCMD are transmitted bit-by-bit. In this embodiment, the command port 203 is an 8-bit register and, in practical implementation, the command port is determined by its requirement. In summary, the serial/parallel converting circuit 202 receives signals serially and outputs signals in parallel. In addition, the serial/parallel converting circuit 202 receives signals in parallel and outputs signals serially.

Referring to FIG. 2, the command port 203 interprets the first field of the TSTCMD, or the test data selection field, as the first test signal (PAT) and sends it to a test data decoder 204. The test data decoder 204 decodes PAT to produce a test data signal (DATA) which contains data actually to be written into the memory being tested. In this embodiment, since the test data selection field contains two bits, four test data combinations can be decoded as the test data for testing the memory.

The command port 203 interprets the third field of the test command TSTCMD, or the selection field, as the second test signal (SEL) and sends it to a selector 205. The selector 205 decodes the SEL to produce a selection signal (TSTSEL) which indicates the circuit module to be tested. The circuit module is either memory devices 207, 208 or 209. Since the selection field consists of two bits, four selections of memory devices being tested can be indicated. Certainly, the number of memory devices to be tested is adjustable and is indicated in the TSTCMD if the length of the TSTCMD and the selection field is appropriately adjusted and redefined. In addition, the testing system is capable of testing circuits other than memory devices, such as testing registers for the purpose of determining whether the data are written into them completely.

The command port 203 interprets the second field of the TSTCMD, or the test mode field, as the third test signal (TSTMOD) and sends it to a state machine, such as a controlling circuitry. According to the (TSTMOD), the state machine determines what test steps are followed. For instance, the controlling circuit 206 determines whether to continue or stop the test according to the TSTMOD.

Different actions of the controlling circuit 206 on the memory device to be tested are performed according to the TSTMOD. The following is a description of what is performed by the controlling circuit 206 when the TSTMOD is set to 0 (i.e. the test mode field of the test command indicates the scan mode).

When the test data are completely written into the memory device being tested, the controlling circuit 206 sends a read controlling signal (CTL) to the memory device being tested and data already stored in the memory device being tested are read and sent to the comparing circuit 210.

The following describes the actions of the controlling circuit 206 when the TSTMOD is set to 1 (i.e. the test mode field of the test command indicates the read-after-write mode). When one unit of test data is written into the indicated memory devices, the controlling circuit 206 sends a CTL to the memory device for reading data stored in the memory device. This data is defined as a memory output signal (TSTOUT) and outputted into the comparing circuit 210. In this test mode, this test is completed when the read-after-write actions on each of the addresses of the tested memory device are performed. If a read/write error occurs in the testing of a unit of test data, the controlling circuit 206 stops the test immediately.

The command port 203 interprets the fourth field of the test command, or the forced failure field, as the fourth test signal (ERROR) and sends it to the controlling circuit 206. When the ERROR signal indicates 1, the controlling circuit stops the test immediately.

In addition to the TSTOUT signal output from the tested memory device, the comparing circuit 210 receives the DATA signal output from the test data decoder 204. After the comparing circuit 210 compares the TSTOUT signal with the DATA signal, it outputs the compare result (TSTSR) to the serial/parallel converting circuit 202 and the controlling circuit 206. If the TSTOUT signal is consistent with the DATA signal, then the TSTSR is 0; otherwise the TSTST is 1. When TSTSR is 1, it indicates an error of the memory device is found in the test and the controlling circuit 206 immediately stops the test. The serial/parallel converting circuit 202 receives the TSTSR and the TSTCMD output from the command port in parallel and serially returns the test output signal TSTO to the test machine 201. The test output signal TSTO includes a starting signal, an additional signal, the TSTCMD, the TSTSR, and the ending signal. Finally, the test machine 201 obtains the test result from the compare result TSTSR of the test output signal TSTO.

Figure 3:
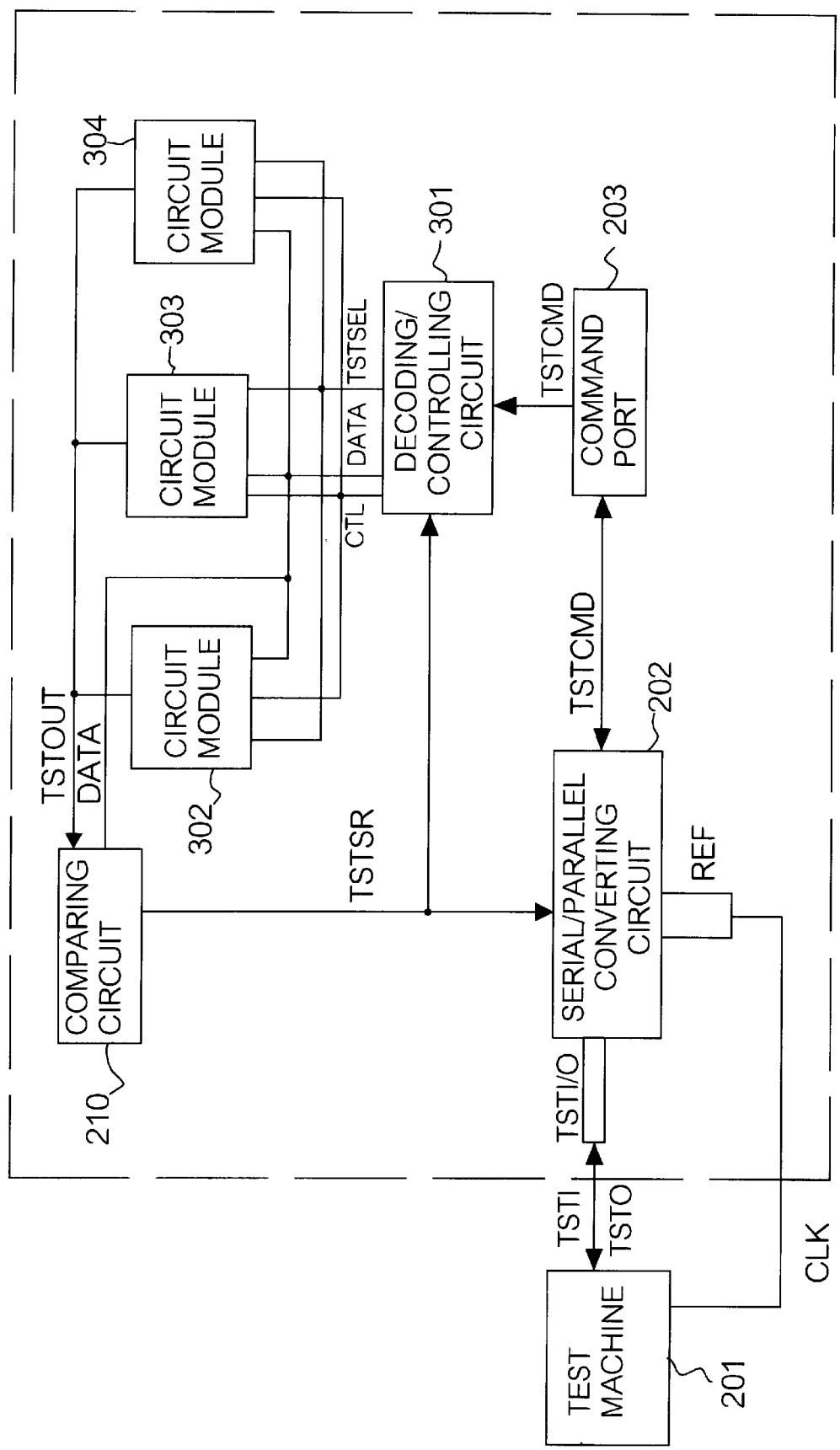
FIG. 3 shows the block diagram of the testing system according to another exemplary embodiment of the invention.

In addition, for the sake of circuit design simplification, the test data decoder 204, the selector 205, and the controlling circuit 206 are integrated into a decoding/controlling circuit 301. The block diagram of the testing system shown in FIG. 3 is the one that uses the decoding/controlling circuit 301. The decoding/controlling circuit 301 receives the TSTCMD and outputs a CTL, a DATA, and a TSTSEL into the circuit modules 302–304.

From the above description, it is disclosed how the testing system and the test machine, between which the test commands and results are serially transferred, detect failures of the memory devices in the chip. With regards to the issue of lack of pins, referring now to FIG. 2, it is found that the serial/parallel converting circuit 202 includes two pins, the reference clock (REF) pin and the test (TSTI/O) pin respectively. The REF pin receives the reference clock from the test machine, and the TSTI and TSTO signals are transferred via the TSTI/O pin. It is obvious that only two pins of the chip are utilized for testing, which basically resolves the issue of lack of pins in function-integrated chip design.

Figure 4A:
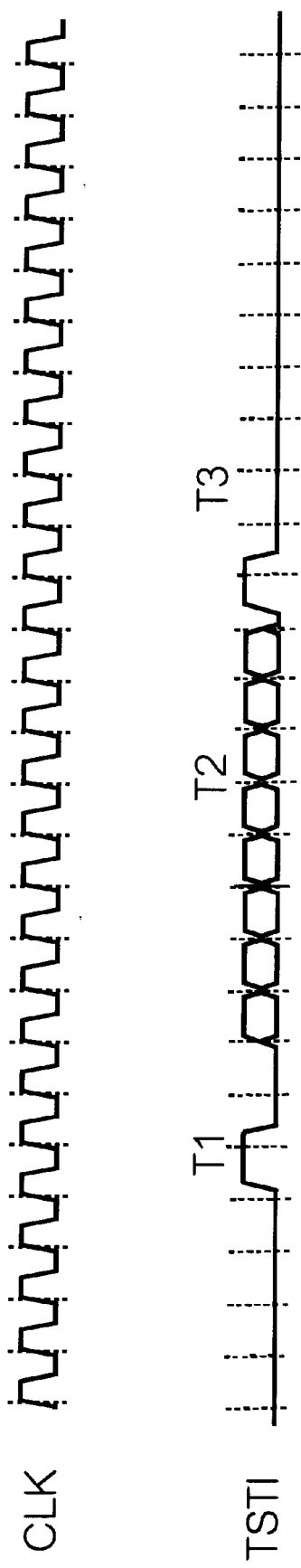
FIGS. 4A–4C show the timing diagram of the test commands.
Figure 4B:
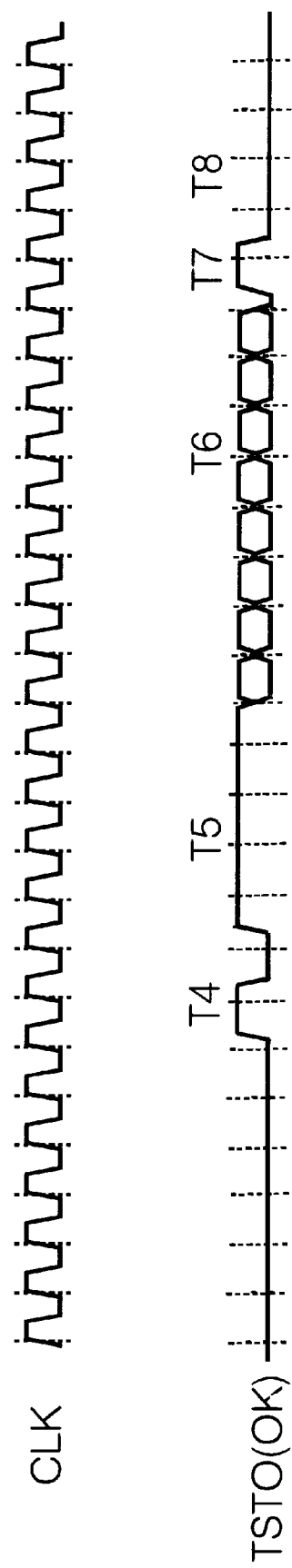
Figure 4C:
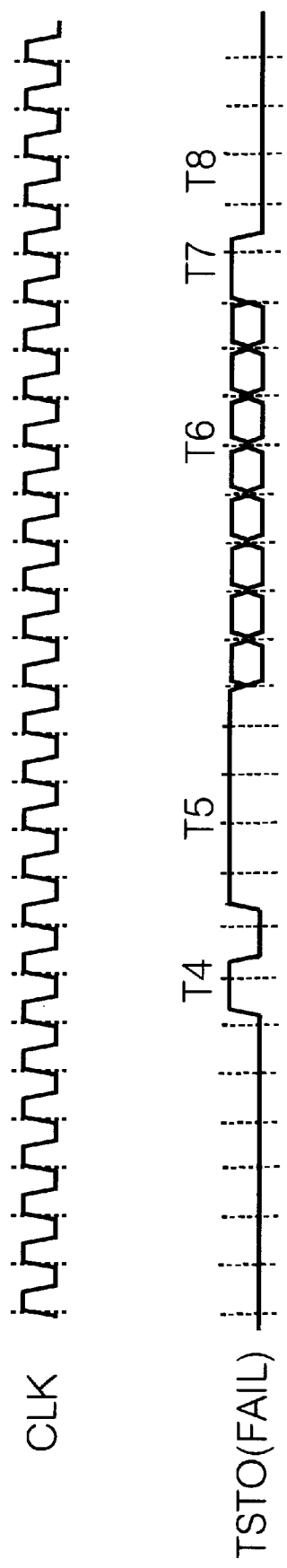

After descriptions of the system operations, the timing of the signals for testing are depicted in the following. Referring now to FIGS. 4A–4C, they show the timing diagrams of the test input instruction signal (TSTI) and the test output signal (TSTO) in various situation, along with the CLK respectively.

FIG. 4A illustrates the transfer of the test input instruction signal (TSTI) from the test machine to the serial/parallel converting circuit. Phase T1 of the TSTI signal indicates the starting signal of the TSTI signal. In this example, the phase T1 contains two CLK periods. In actuality, the number of periods the starting signal takes is defined in accordance with the requirements of the system (e.g. one CLK period, two CLK periods, or other appropriate number of periods.) For the sake of simplification, it assumes that the starting signal takes two CLK periods in this embodiment. It is noted that this assumption does not mean that the starting signal of the invention is restricted to this setting. The starting signal of the TSTI signal informs the testing system that it is time to prepare to accept the test command. The signal during phase T2 is the test command generated from the test machine, wherein T2 contains eight CLK periods. The signal during phase T3 is the ending signal of the TSTI signal, wherein phase T3 contains two CLK periods. The ending signal of the TSTI signal informs the testing system that the delivery of the test command is complete.

The FIG. 4B illustrates the timing diagram of the test output signal (TSTO) outputted from the serial/parallel converting circuit when the test result is success. As described above, the reference clock utilizes the PCI clock. In FIG. 4B, the signal during phase T4 is the starting signal of the TSTO signal, wherein phase T4 contains two CLK periods. The starting signal of the TSTO signal informs the testing system that it is time to prepare to receive the test result. Phase T5 is additional and its length is defined according to the design of the testing system. During phase T6, the signal indicates the test command like the one during phase T2. During phase T7, the signal indicates the compare result (TSTSR) wherein the phase T7 contains one CLK period. In FIG. 4B, the signal during phase T7 indicates that the test result is success (TSTSR is set to zero). The TSTO signal is ended with the ending signal during phase T8 with the length of one CLK period. Like the starting signal described above, the number of periods the ending signal takes is defined according to the requirements of the system (e.g. one CLK period, two CLK periods or other appropriate number of periods.) For the sake of simplification, it assumes that the ending signal takes two CLK periods in this embodiment. It is noted that this assumption does not mean that the ending signal of the invention is restricted to this setting.

Referring now to FIG. 4C, the timing diagram of the test output signal (TSTO) is illustrates when the test result is failure. It is noted that phases T1–T8 in FIG. 4C corresponding to the same phases in FIG. 4B have the same indications except that the signal during phase T7 shown in FIG. 4C indicates that the test result is failure (TSTSR is set to 1).

Figure 5:
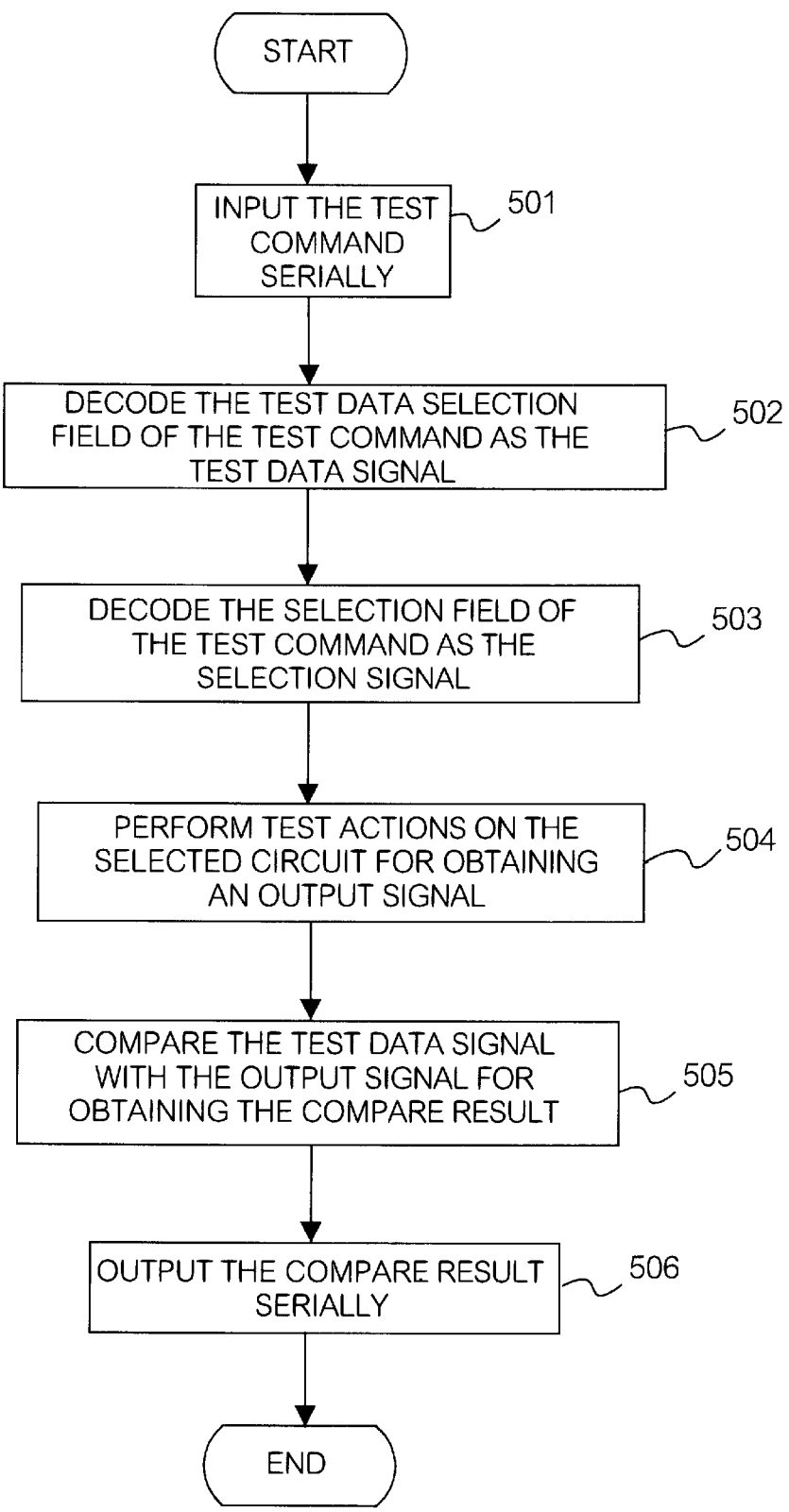
FIG. 5 is a flowchart of the method according to the preferred embodiment of the invention for the testing of memory devices.

Furthermore, according to the object of the invention, a method for testing a circuitry that is integrated into a chip is disclosed. FIG. 5 illustrates the testing method in a flowchart which indicates the method beginning in step 501. In step 501, a test command is inputted serially and the data format of the test command is shown as FIG. 1. It is noted that the testing method can be applied to various kinds of chips if the data format of the test command shown in FIG. 1 is appropriately modified. After step 501, the method proceeds to step 502. In step 502, the test data selection field of the test command is decoded as the test data signal. Next, in step 503, the selection field of the test command is decoded as the selection signal, indicating that one of the circuits to be tested in the chip is selected to receive the test data signal. After step 503, the method proceeds to step 504 in which test actions on the selected circuit are performed to obtain an output signal. The test actions correspond to the test mode field of the test command. After step 504, the method proceeds to step 505. In step 505, the output signal is compared with the test data signal to obtain the test compare result, and the method proceeds to step 506. Finally, in step 506, the test compare result and other related signals are serially outputted.

The invention is applicable to the testing of other similar devices, such as DRAM, as well as the embedded SRAM described above. In addition, the invention is applicable to the testing of a specific function of different memory devices or the testing of various functions of a memory device. Furthermore, the invention is applicable to the testing of whether the data have been completely written into a register. If so, the test result is 1. If not, the test result is 0. Thus, the comparing circuit is not necessary when the invention is applied to the testing of the register and the test result is outputted into the test machine without the comparing circuit.

In addition to the applications of the invention, the length of the test command is not restricted to 8-bit and the length of the test command is adjustable according to the requirements of the state machine and the circuit module to be tested. With respect to the modifications of the definition of the test command, the associated decoder for decoding the test commands is modified as well.

On the other hand, from FIGS. 4A–4C, it is apparent that the speed at which the device is tested is relevant to the frequency of the reference clock CLK. Thus, the speed at which the device is tested can be increased by increasing the frequency of the reference clock CLK provided that the timing of CLK is set under the allowance for it.

The preferred embodiment of the testing system of the invention disclosed above utilizes only two pins for transferring the test commands serially in a complete test. By only using such a few pins, the issues of lack of pins and pin-sharing method do not occur with the chips that the invention is applied to. When there is not enough pins for using the PIO method in the testing of a chip, using the present invention instead results in saving a part of the pins required in PIO method without diminishing the test functions of the chip.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A testing system in a chip, for testing a circuit module of the chip, the testing system receiving a reference clock and a test input signal outputted serially from a test machine, the testing system comprising:
    a serial/parallel converting circuit for receiving the reference clock and the test input signal serially, producing a test command signal in parallel, and sending a test output signal to the test machine;
    a command port for receiving and storing the test command signal, and for outputting a first test signal and a second test signal;
    a selector for receiving the second test signal and producing a selection signal for selecting the circuit module of the chip;
    a test data decoder for receiving the first test signal, and producing a test data signal as an input to the circuit module selected; and
    a controlling circuit for outputting a controlling signal into the circuit module selected, wherein the circuit module produces the test output signal.

2. The testing system according to claim 1, wherein the reference clock is the clock of the peripheral component interconnect (PCI) bus.

3. The testing system according to claim 1, wherein the command port is a register.

4. The testing system according to claim 1, wherein the circuit module is a register.

5. The testing system according to claim 1, wherein the test command signal comprises a test data selection signal, a test mode signal, a selection signal, a forced failure signal, and a reserved signal.

6. The testing system according to claim 5, wherein the controlling circuit stops the test when the forced failure signal of the test command signal is at high level voltage.

7. The testing system according to claim 1, wherein the circuit module is embedded static random access memory.

8. The testing system according to claim 7, further comprising a comparing circuit, wherein the selected circuit module, in response to the test data signal, produces a circuit module output signal, and the comparing circuit, in response to the circuit module output signal and the test data signal, produces a compare result signal, and transmits the compare result signal to the controlling circuit and the serial/parallel converting circuit.

9. A testing system in a chip, for testing a circuit module of the chip, the testing system receiving a reference clock and a test input signal outputted from a test machine serially, the testing system comprising:
    a serial/parallel converting circuit for serially receiving the reference clock and the test input signal, producing a test command signal in parallel, and sending a test output signal to the test machine;
    a command port for storing and outputting the test command signal; and
    a decoding/controlling circuit for receiving the test command signal, and producing a controlling signal and a test data signal, wherein the circuit module of the chip, in response to the controlling signal and the test data signal, produces the test output signal.

10. The testing system according to claim 9, wherein the reference clock is the clock of the peripheral component interconnect (PCI) bus.

11. The testing system according to claim 9, wherein the command port is a register.

12. The testing system according to claim 9, wherein the circuit module is a register.

13. The testing system according to claim 9, wherein the test command signal comprises a test data selection signal, a test mode signal, a selection signal, a forced failure signal, and a reserved signal.

14. The testing system according to claim 13, wherein the decoding/controlling circuit comprises:
  a selector, in response to the selection signal of the test command signal, producing a selection signal for selecting the circuit module of the chip;
  a controlling circuit, in response to the test mode signal and the forced failure signal of the test command signal, producing the controlling signal which is sent to the circuit module; and
  a test data decoder, in response to the test data selection signal of the test command signal, producing the test data signal which is sent to the circuit module.

15. The testing system according to claim 9, the circuit module is an embedded static random access memory.

16. The testing system according to claim 15, further comprising a comparing circuit, wherein the circuit module, in response to the test data signal, produces a circuit module output signal, and the comparing circuit, in response to the circuit module output signal and the test data signal, produces a compare result signal, and transmitting the compare result signal to the decoding/controlling circuit and the serial/parallel converting circuit.

* * * * *